(12) United States Patent
Tsai et al.

(10) Patent No.: US 6,593,185 B1
(45) Date of Patent: Jul. 15, 2003

(54) METHOD OF FORMING EMBEDDED CAPACITOR STRUCTURE APPLIED TO LOGIC INTEGRATED CIRCUIT

(75) Inventors: Teng-Chun Tsai, Hsin-Chu (TW); Chia-Lin Hsu, Taipei (TW); Yi-Fang Cheng, Hsin-Chu (TW); Yi-Hsiung Lin, Chang-Hua (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/150,385

(22) Filed: May 17, 2002

(51) Int. Cl.⁷ .......................................... H01L 21/8242
(52) U.S. Cl. ........................ 438/253; 438/3; 438/240; 438/396; 438/640; 438/673; 438/701
(58) Field of Search ................... 438/3, 240, 253–256, 438/396–399, 637–640, 672–673, 675, 687–688, 701

(56) References Cited

U.S. PATENT DOCUMENTS 6,271,082 B1 * 8/2001 Hou et al. .................. 438/250
6,346,454 B1 * 2/2002 Sung et al. ................. 438/396
6,452,251 B1 * 9/2002 Bernstein et al. ........... 257/532
6,472,721 B2 * 10/2002 Ma et al. .................... 257/531

* cited by examiner

Primary Examiner—Carl Whitehead, Jr.
Assistant Examiner—Thanh Nguyen
(74) Attorney, Agent, or Firm—Merchant & Gould P.C.

(57) ABSTRACT

A method for fabricating a vertical three-dimensional metal-insulator-metal capacitor (MIM capacitor) structure is disclosed. The present invention utilized a vertical three-dimensional MIM capacitor structure on the substrate to decrease the structure area of the MIM capacitor in logic integrated circuit and integration for copper dual damascene process at an identical capacitance on a chip; therefore, the capacitance density of the vertical three-dimensional capacitor can be increased. Furthermore, the present invention is provided a method for fabricating the vertical three-dimensional MIM capacitor structure that compatible with the fabrication of the copper dual damascene structure such that the number of the photomask during the fabrication process can be reduced.

6 Claims, 10 Drawing Sheets

METHOD OF FORMING EMBEDDED CAPACITOR STRUCTURE APPLIED TO LOGIC INTEGRATED CIRCUIT

BACKGROUND OF THE INVENTION

1. Field of the Invention

The present invention generally relates to a vertical three-dimensional MIM capacitor structure (metal-insulator-metal capacitor structure), and more particularly to a method for fabricating a vertical three-dimensional metal-insulator-metal capacitor (MIM Capacitor) structure that is compatible with the fabrication process of a copper dual damascene in logic integrated circuit and integration for copper dual damascene process.

2. Description of the Prior Art

Precision capacitors for complementary metal oxide semiconductor (CMOS) analog applications are generally metal-insulator metal (MIM) capacitor or polysilicon-insulator-polysilicon (PIP) capacitors.

However, PIP capacitors are becoming less popular because they present a number of problems when used with complementary metal oxide semiconductor (CMOS) technologies. More specifically, PIP capacitors are generally performed before the CMOS structures and the heat and oxidation cycles that occur during the CMOS production process degrade the PIP capacitors. Further, the sophistication of analog circuits is improving which requires that the variation in the capacitance be decreased and preferably maintained at a voltage of approximately 25 ppM. However, PIP capacitors suffer from carrier depletion that changes the capacitance as surface voltage across the PIP capacitor changes. Therefore, PIP capacitors do mot maintain the linearly required in today's sophisticated analog circuits. Further, PIP capacitors often trap charge within the insulator during their use.

Therefore, MIM capacitors, which are usually formed after the CMOS production process, are generally becoming more popular for analog circuits. However, MIM capacitors also present manufacturing problems. More specifically, conventional MIM capacitors with a $SiO_2$ insulator cannot be used over copper damascene metal wiring because copper diffuses through the capacitor structure and create leakage current. In other words, the copper is not a good electrode in the conventional capacitor structures. Therefore, conventional MIM capacitors are generally only used with aluminum wiring. This is a substantial disadvantage because copper dual damascene wiring is becoming popular in CMOS technologies because copper is less expensive and has better conductivity and electromigration resistance when compared to aluminum wiring. Therefore, there is a need for a process and structure that allow MIM capacitors to be used with copper dual damascene wiring.

In the present semiconductor mix mode integrated circuits process, the plate capacitor structure such as MIM capacitor as. showed in the FIG. 1. The traditional plate MIM capacitor structure may includes a first metal line $M_x$ 102 is embedded within the substrate 100, wherein subscript x represents the xth metal layer. The plate MIM capacitor structure may also include a first plate (bottom plate) 104 on the substrate 100, a first dielectric layer (bottom dielectric layer) 106 on the first plate 104, a top plate (second plate) 108 on the first dielectric layer 106, and a second plate dielectric (top plate dielectric) 110 on the second plate 108. The second metal line $M_{x+1}$ 112 contacts the exposed portion of the first metal line $M_x$ 102, wherein the subscript x+1 represents x+1th metal layer. In the traditional plate MIM capacitor structure, the plate MIM capacitor requires a large chip area to satisfy the designed capacitance. Further, the traditional plate MIM capacitor requires three extra photo-mask to define the first plate 104, dielectric layer 106, and second plate 108, respectively and the process is difficult to be comparable with the copper dual damascene interconnect manufacturing flow.

SUMMARY OF THE INVENTION

In accordance with the present invention, a structure and a method is provided for forming a vertical three-dimensional metal-insulator-metal capacitor (MIM capacitor) on the substrate in logic integrated circuit and integration for copper dual damascene process, which is compatible with a copper dual damascene fabrication process, that substantially diminish the area of MIM capacitor at identical capacitance in logic integrated circuit.

It is one object of this invention is to provide a structure of a vertical three-dimensional MIM capacitor on the substrate that can diminish the space structure on the chip in logic integrated circuit.

It is another object of this invention is to provide a vertical three-dimensional MIM capacitor structure on the substrate to increase the capacitance density in logic integrated circuit.

It is a further object of this invention is to decrease the fabricating steps during the fabricating the vertical three-dimensional MIM capacitor structure.

It is still an object of this invention is to fabricate the vertical three-dimensional MIM capacitor structure with high capacitance density that the fabricating process is compatible with the copper dual damascene wiring process.

According to above-mention, an embedded capacitor applied to logic integrated circuit, such as a vertical three-dimensional MIM capacitor structure may be formed on a substrate, wherein the substrate having a remaining hard mask layer and a portion of the prior metal line therein. Herein, the portion of the prior metal line is used as a first metal electrode plate of the vertical three-dimensional MIM capacitor structure. The vertical three-dimensional MIM capacitor structure according to the present invention may include a second metal electrode plate that electrically coupled the first metal electrode plate by using a middle contact structure, wherein said middle contact structure on said first metal electrode plate being exposed on substrate. In the meanwhile, a copper dual damascene structure adjacent the vertical three-dimensional MIM capacitor structure on the substrate, and also electrically coupled the prior metal line being exposed on substrate. Due to the MIM capacitor structure is a vertical three-dimensional structure such that the requiring structure space of the capacitor structure on the chip can be diminished in the logic integrated circuit.

The process for forming a vertical three-dimensional MIM capacitor structure is compatible with a copper dual damascene structure fabrication process. The method for forming the vertical three-dimensional MIM capacitor is according to the present invention may include sequentially formed a first cap layer, a first dielectric layer, and a first hard mask layer on the substrate. Then, a via opening and a trench opening of the first layer of the copper dual damascene structure and the middle structure of the vertical three-dimensional MIM capacitor are formed simultaneously by using two photolithography processes, wherein the middle contact structure is used to electrically couple the first metal electrode plate. Next, a first copper layer is deposited to fill with the via opening and trench opening to form a first layer of the copper dual damascene structure, and the portion structure of the middle contact structure. Then, a second cap layer is formed on the above structure. Next, a third photoresist layer is covered on the copper dual damascene structure to form an opening of the middle contact structure. After the third photoresist layer is removed, a blanket insulator layer is deposited on the second cap layer that is not removed and on the sidewall of opening of the middle contact structure. Then, a second copper layer is deposited to fill with in the opening of the middle contact structure to form an inverse U-type contact, and the excess second copper layer is planarized by polishing process. Thereafter, a second dielectric layer and a second hard mask layer are sequentially formed on the structure of abovementioned after the second copper layer is planarized. Then, a second metal electrode plate and a second layer of the copper dual damascene structure (second metal electrode plate of the vertical three-dimensional MIM capacitor structure) are defined simultaneously by using conventional copper dual damascene techniques. Next, a third cap layer is formed on the above structure. Therefore, due to the fabrication of the vertical three-dimensional MIM capacitor is compatible with the fabricating the copper dual damascene structure process such that the number of the photo-mask can be diminished during the fabricating the vertical three-dimensional MIM capacitor structure.

Other objects, advantages and salient features of the invention will become apparent from the following detailed description taken in conjunction with the annexed drawings, which disclosed preferred embodiments of the invention.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Some sample embodiments of the invention will now be described in greater detail. Nevertheless, it should be recognized that the present invention can be practiced in a wide range of other embodiments besides those explicitly described, and the scope of the present invention is expressly not limited except as specified in the accompanying claims.

According to the present invention is to provide a mix mode logic integrated circuit device comprises a vertical three-dimensional MIM capacitor structure and a copper dual damascene structure are simultaneously on the substrate, wherein the substrate having a prior metal line and a remaining hard mask layer are embedded in the substrate. One of the embodiments for the present invention, the portion of the prior metal line used as a first metal electrode plate of the vertical three-dimensional MIM capacitor structure. Another portion of the prior metal line is electrically coupled the copper dual damascene structure.

The structure of the vertical three-dimensional MIM capacitor structure may include a middle contact structure within a first dielectric layer that is between the first metal electrode plate and second metal electrode plate, and used to electrically couple the first and second metal electrode plates. The middle contact structure may include a contact on the first metal line being exposed on the substrate, and a blanket insulator layer on the sidewall of the contact to raise the capacitance of the capacitor structure, The middle contact structure also may include an inverse U-type contact on the insulator layer. The second metal electrode plate of the vertical three-dimensional MIM capacitor structure may include a metal layer on the middle contact structure and within a second dielectric layer. Accordingly, the vertical three-dimensional MIM capacitor structure are constituted from the first metal electrode plate, middle contact structure, and second metal electrode plate, such that the space structure of capacitor can be diminished and the capacitance density can be raised.

Moreover, according to one of the embodiment of the present invention, the fabrication of the vertical three-dimensional MIM capacitor structure is compatible with the copper dual damascene fabricating process on the substrate, such that the space of the vertical three-dimensional MIM capacitor structure which is smaller than the prior plate MIM capacitor structure defined on the chip.

Figure 1:
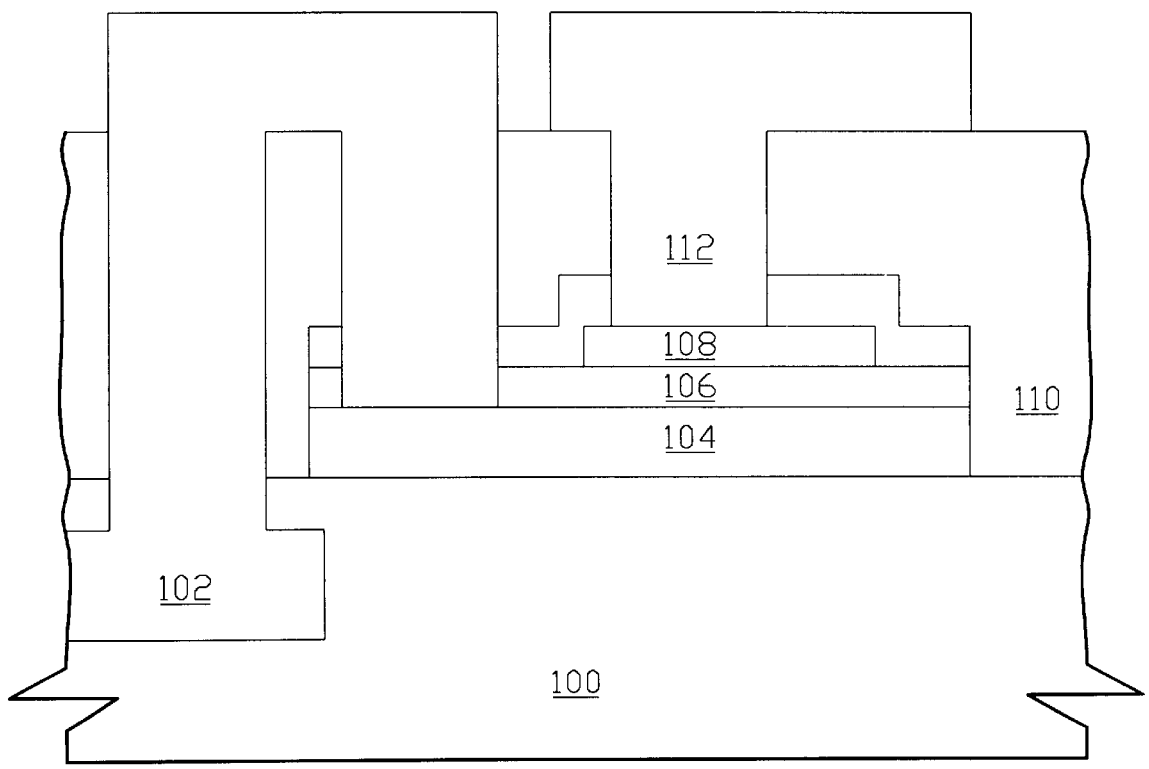
FIG. 1 is schematic representation of structures at various stages during the formulation of a traditional plate metal-insulator-metal capacitor (MIM capacitor) structure using conventional, prior art technique.
Figure 2:
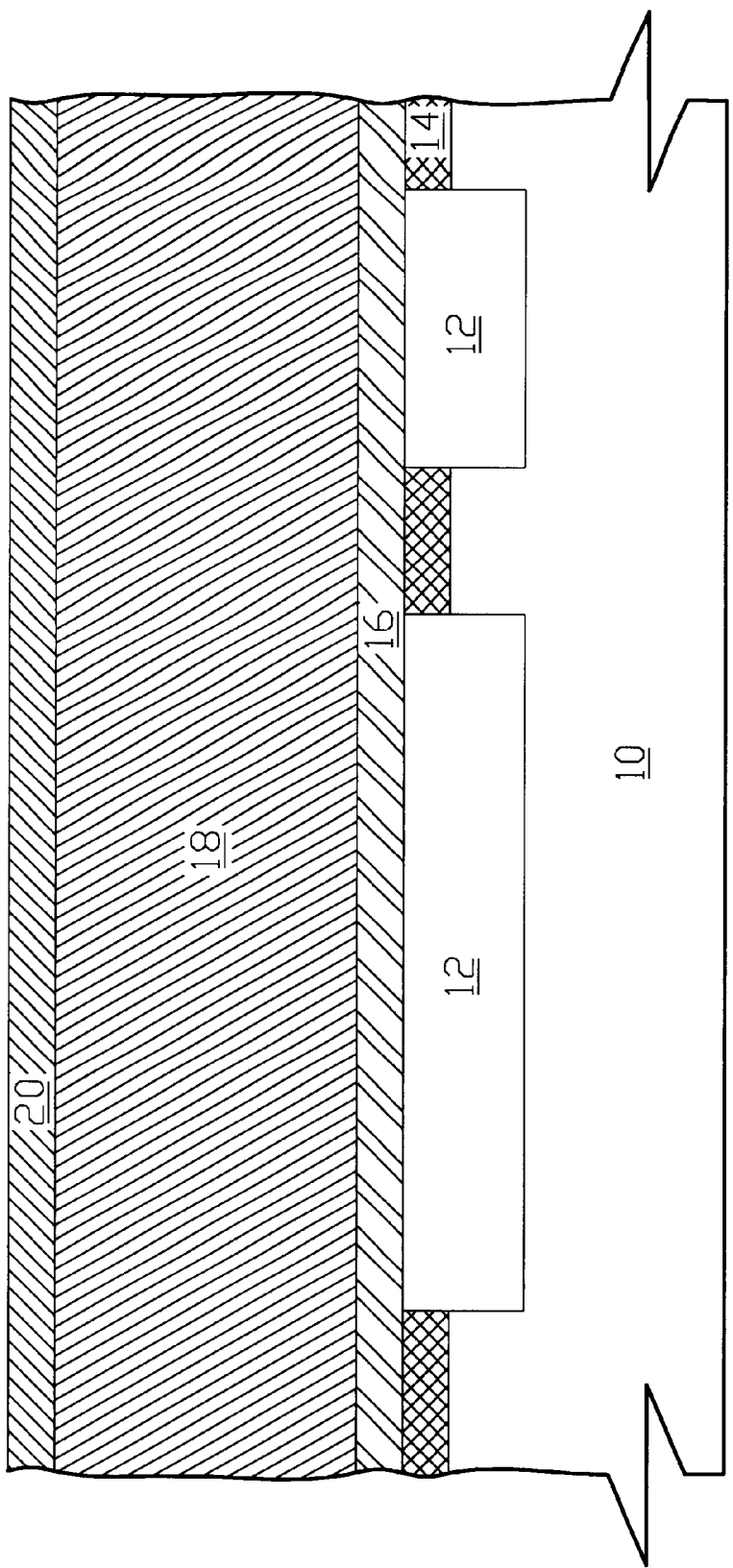
FIG. 2 to FIG. 4 is schematic representations for forming a middle contact structure of the vertical three-dimensional MIM capacitor structure) within a first dielectric layer, and a first layer of the copper dual damascene structure on the substrate simultaneously.

Referring to FIG. 2, a first cap layer 14 is deposited on the substrate 10, wherein the substrate 10 having a prior metal line 12 which is used as a first metal electrode plate of the vertical three-dimensional metal-insulator-metal capacitor (MIM capacitor) structure and a remaining hard mask layer 14 are embedded within the substrate 10. The material of the first cap layer 14 can be SiN (silicon nitride) or SiC (Silicon Carbide). Then, a first dielectric layer 18 and a first hard mask layer 20 with thickness between 100 to 1000 Å are sequentially formed on the first cap layer 16. The material of the first dielectric layer 18 can be $SiO_2$, FSG, low dielectric constant (low-k) layer, or ultra low k dielectric layer. Furthermore, due to the above material of the dielectric layer such as FSG and some CVD low-k dielectric material can be polished by CMP (chemical mechanical polishing) process and the properties of the dielectric material will not be changed while the dielectric material contacts the CMP solution, such that the hard mask layer will not be used as a stop layer in polishing process. Therefore, the hard mask layer can be an optional process during fabricating the vertical three-dimensional MIM capacitor layer.

Figure 3:
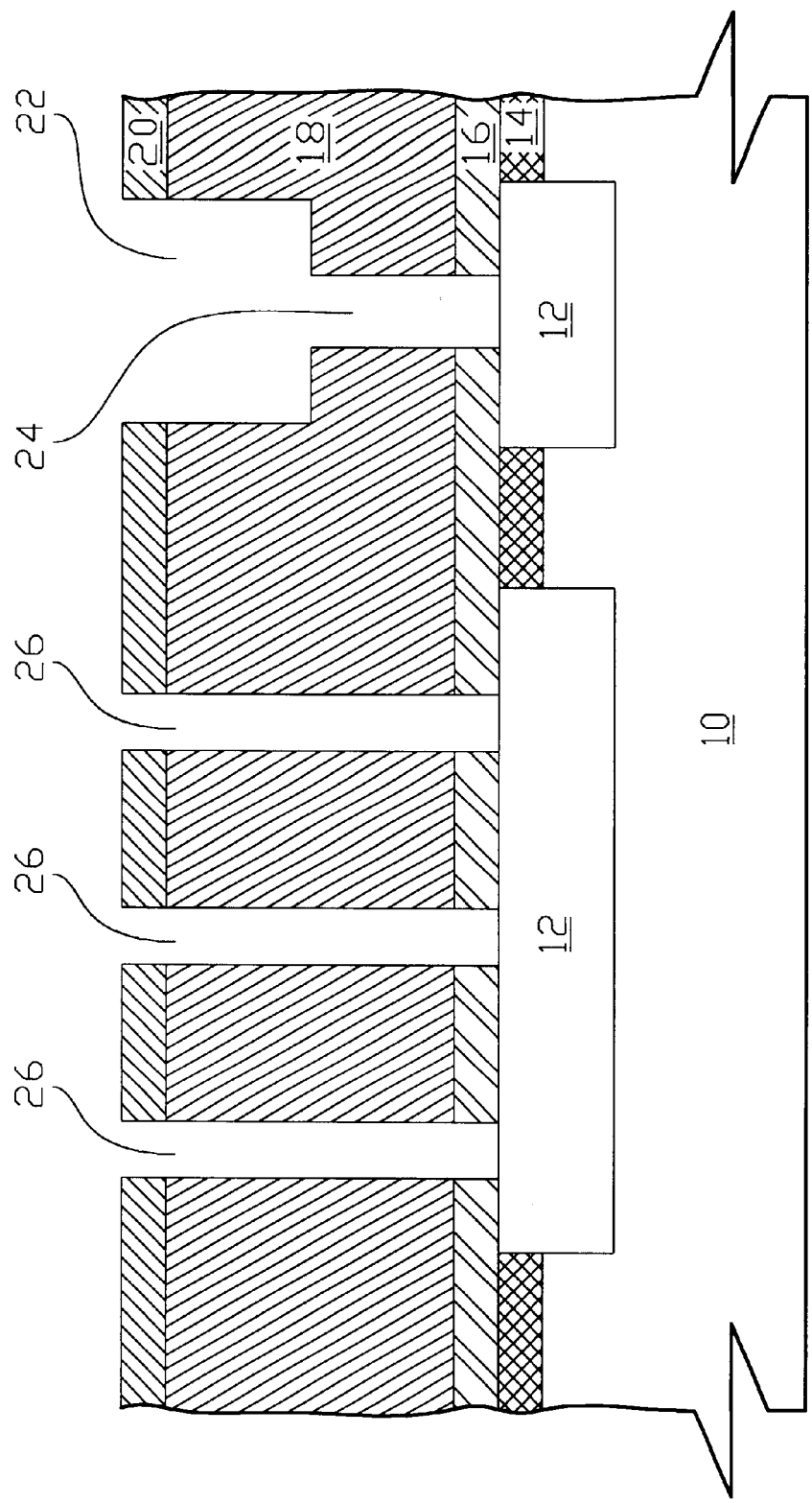
Figure 4:
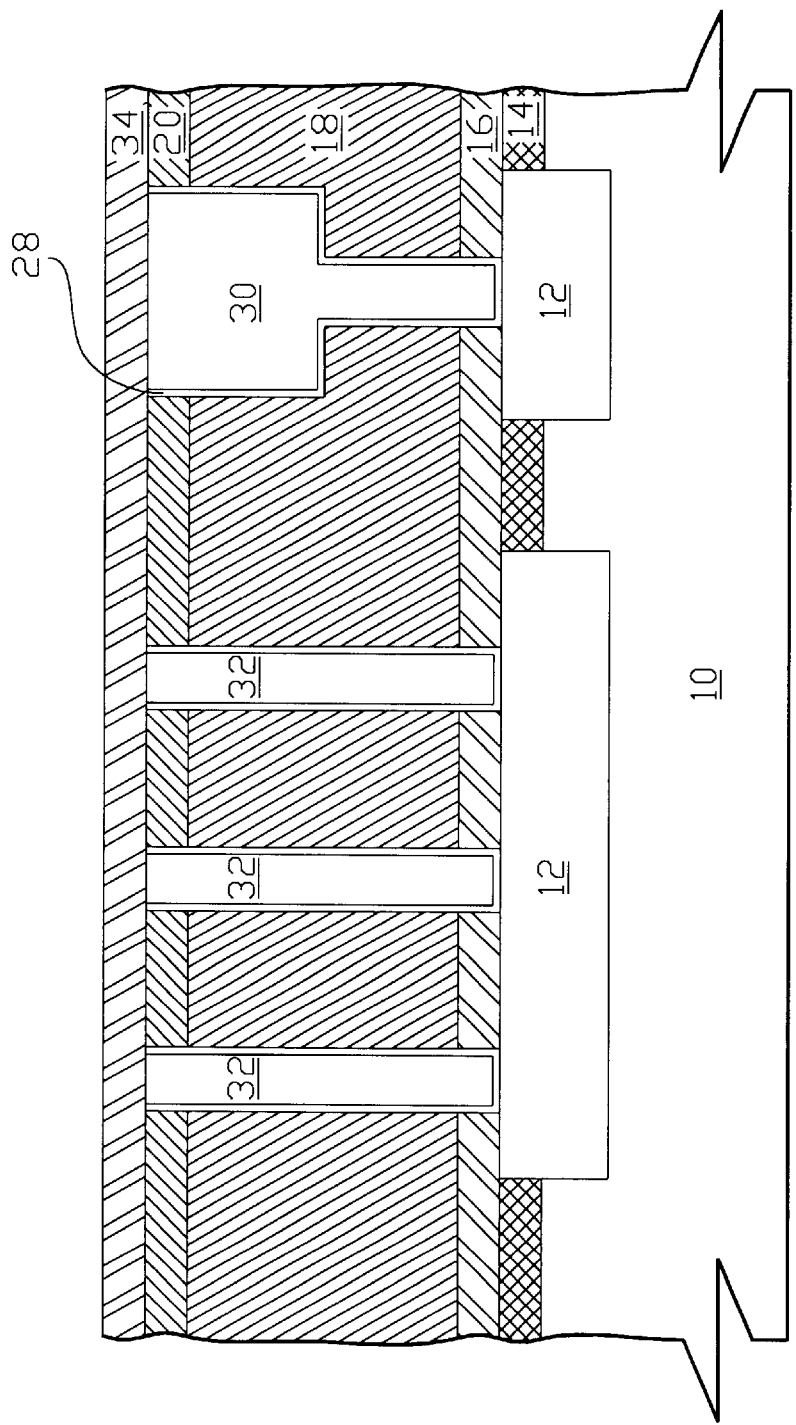

Next, referring to FIG. 3 and FIG. 4, there are two photolithography processes on the first cap layer 16 to form a first via opening 24 and a first trench opening 22 of a copper dual damascene structure, and an opening 26 of the middle contact structure of the vertical three-dimensional MIM capacitor. In the FIG. 4, a first liner layer 28 is deposited on the sidewall of the first trench 22 and the first via 24 of the copper dual damascene structure and the opening 26 of the middle contact structure of the vertical three-dimensional MIM capacitor structure to prevent the metal layer such as copper in the trench or via will be diffused into the dielectric layer to cause the breakdown or leakage current issue of the electronic device. Then, the first copper metal layer is deposited to fill with the first trench opening 22 and the first via opening 24 of the copper dual damascene structure and the opening 26 of the middle contact structure of the vertical three-dimensional MIM capacitor to form a contact 30 within the first hard mask layer 20 and the first dielectric layer 18, wherein the contact 30 is electrically coupled the first metal electrode plate 12. Then, the excess the first copper metal layer and the first liner layer 28 are planarized by first polishing process and stop on the first hard mask layer 20, wherein the first hard mask layer 20 is used as a stop layer for first polishing process. Next, a second cap layer 34 is formed on the structure of the abovementioned.

Figure 5:
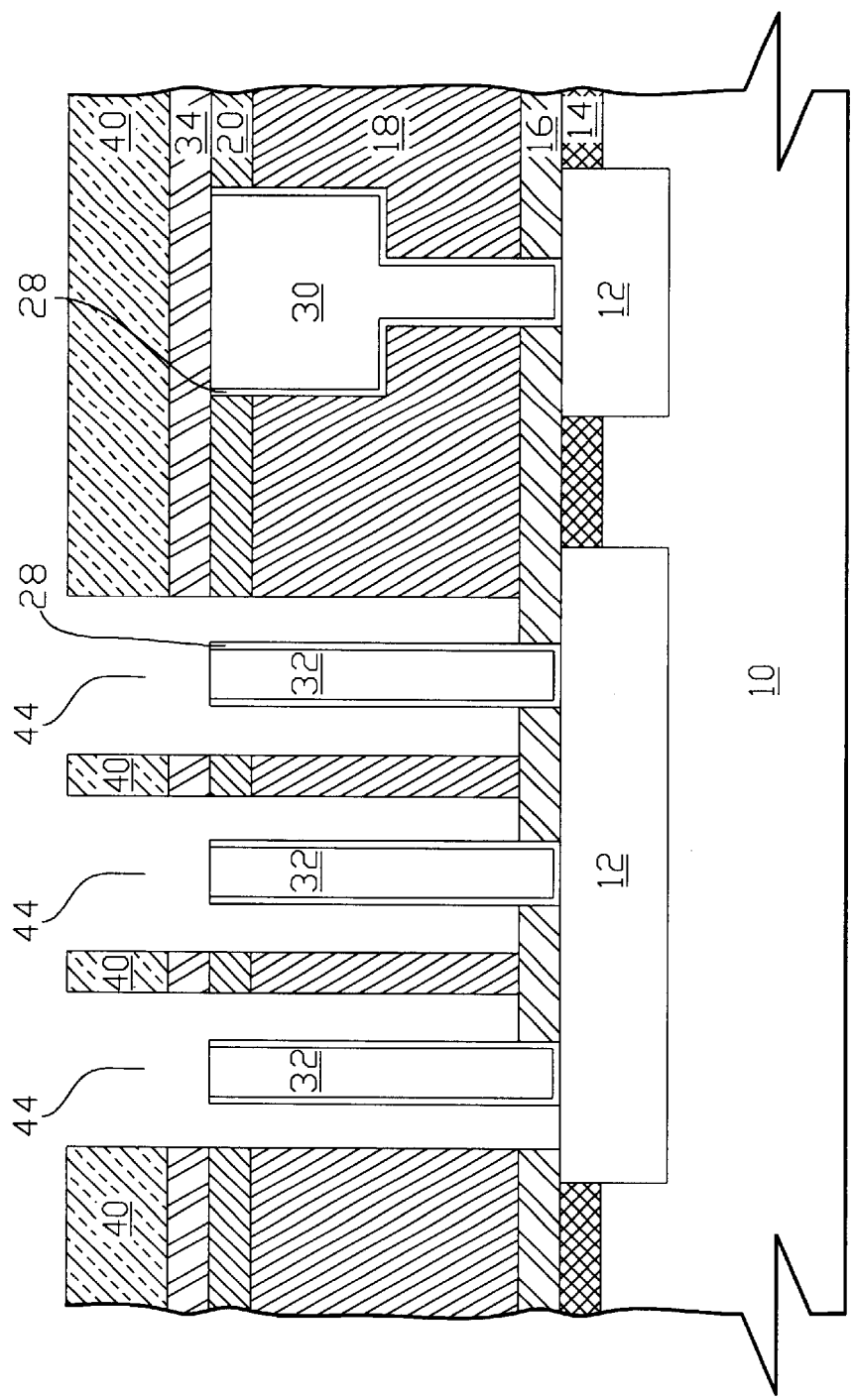
FIG. 5 to FIG. 8 are schematic representations of structures at various stages during the formulation of the second layer of the copper dual damascene structure, and the middle contact structure of a vertical three-dimensional MIM capacitor to electrically couple the first metal electrode plate in accordance with a method disclosed; and FIG. 9 to FIG. 10 is schematic representations of structures at various stages during the formulation of the vertical three-dimensional MIM capacitor is compatible with the copper dual damascene structure in accordance with a method disclosed herein.
Figure 6:
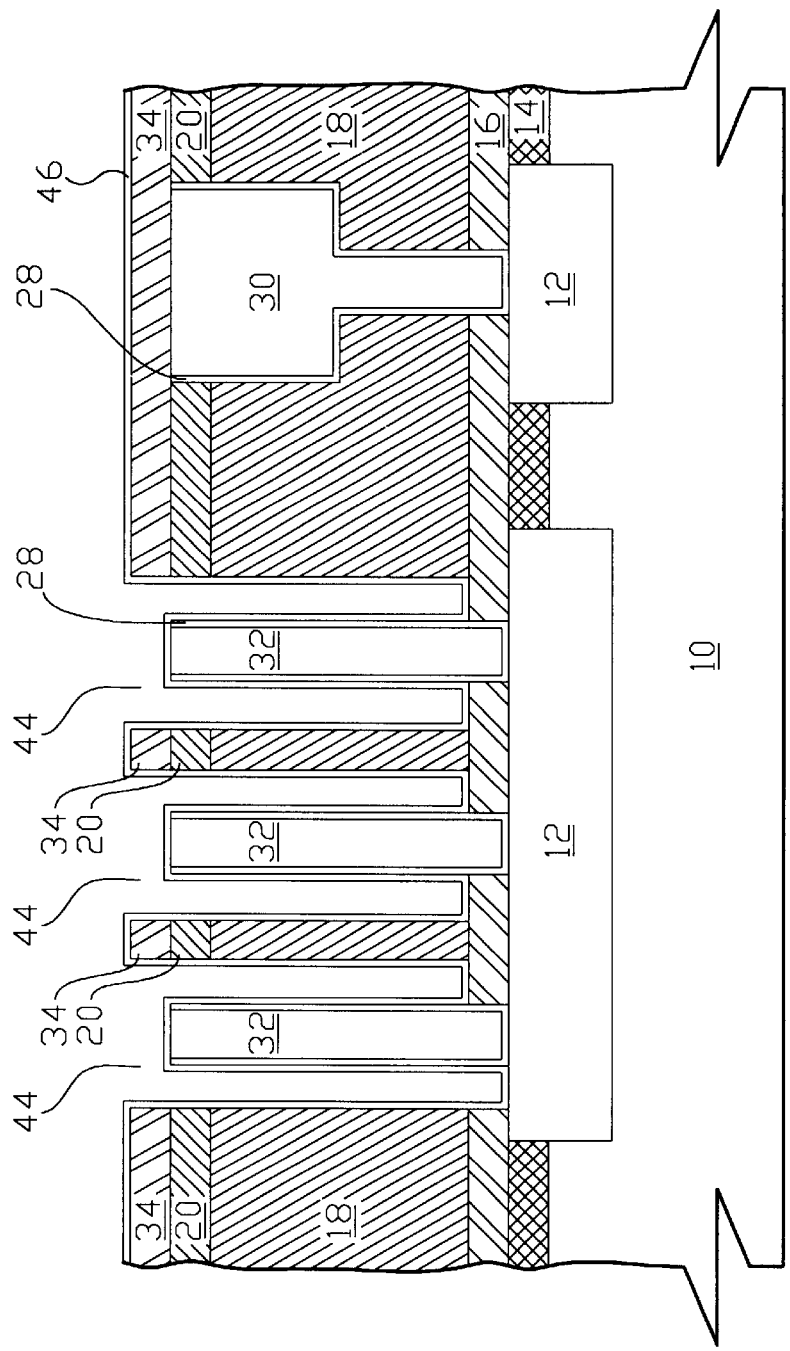

Thereafter, referring to FIG. 5, a third photoresist layer 40 is formed cover the portion of the structure of FIG. 4. Then, the portion of the second cap layer 34, first hard mask layer 20, and a first dielectric layer 18 are sequentially removed by an etching process to form an inverse U-type opening 44 of the middle contact structure. Next, referring to FIG. 6, a blanket insulator layer 46 is deposited on the second cap layer 34, and the sidewall of the inverse U-type opening 44 of the middle contact structure of the vertical three-dimensional MIM capacitor after the remaining third photoresist layer 40 is removed. The material of the insulator layer 46 can be an oxide or a SiN. The preferable material of the insulator layer 46 for the present invention can be a high dielectric constant layer. The high dielectric constant layer has a higher coupling ratio that can raise the capacitance density of the capacitor structure. The material of the high dielectric constant layer can be $Ta_2O_5$, $Al_2O_3$, or BSTO (barium strontium titanium oxide).

Figure 7:
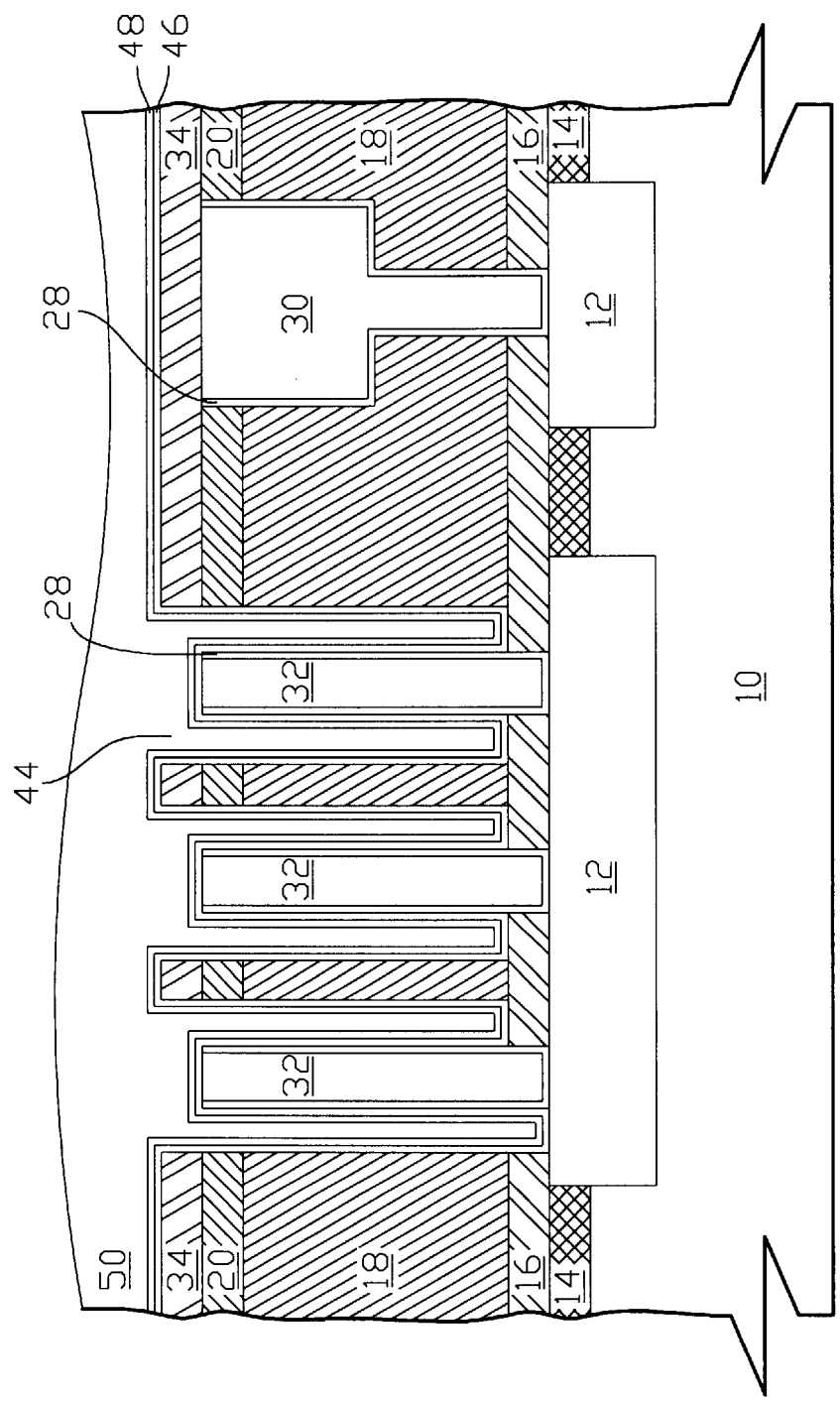

Then, referring to FIG. 7, the second liner layer 48 is formed on the blanket insulator layer 46 and the sidewall of the inverse U-type opening 44 of the middle contact structure of the vertical three-dimensional MIM capacitor by a PVD method (physical vapor deposition method) or a CVD method (chemical vapor deposition method). Then, a second copper metal layer 50 is electroplated to fill with the inverse U-type opening 44 of the middle contact structure to form an inverse U-type contact 52 within the first dielectric layer 18. Then, the excess second metal layer 50 on the second liner layer 48 is planarized by second polishing process (chemical mechanical polishing process) and stop on the second liner layer 48 as shown in FIG. 8.

Figure 8:
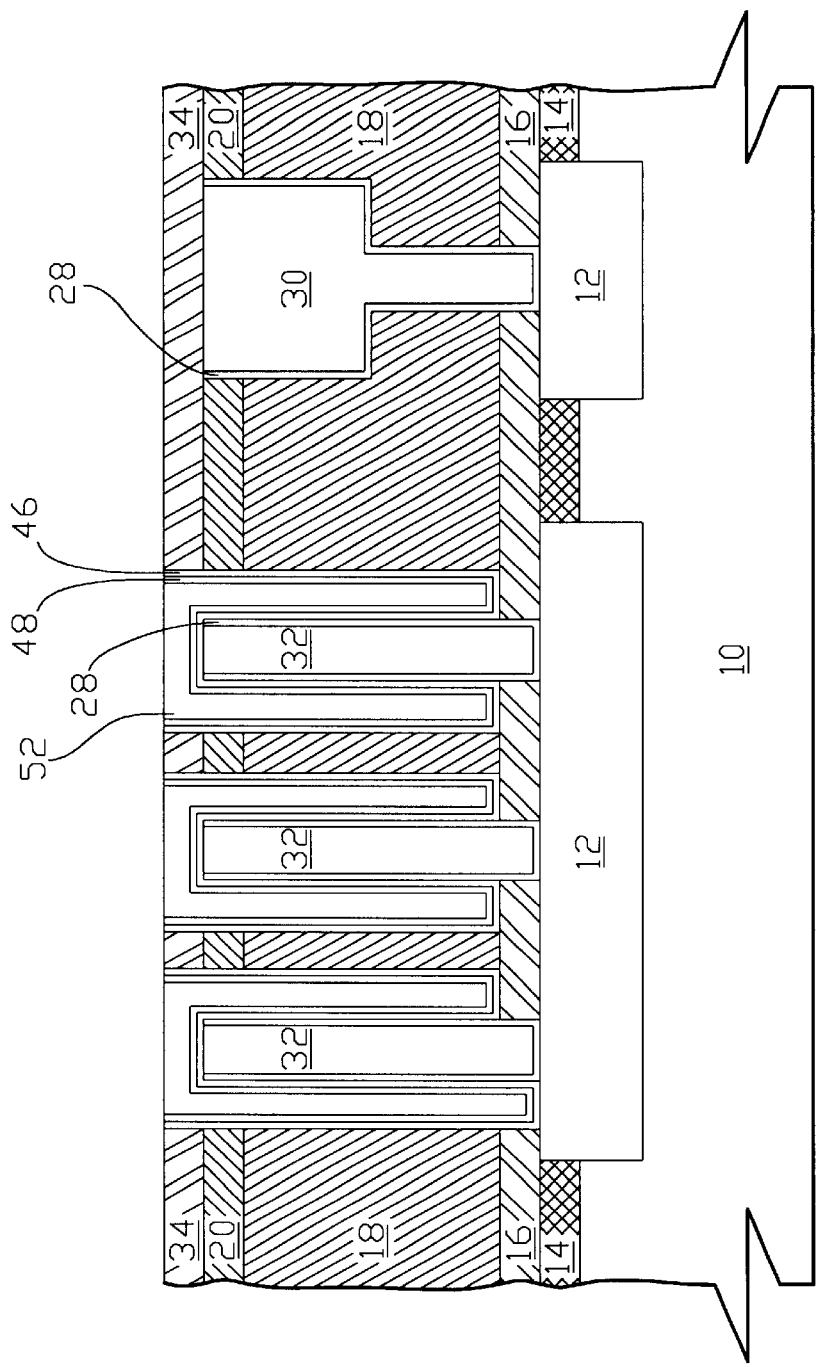
Figure 9:
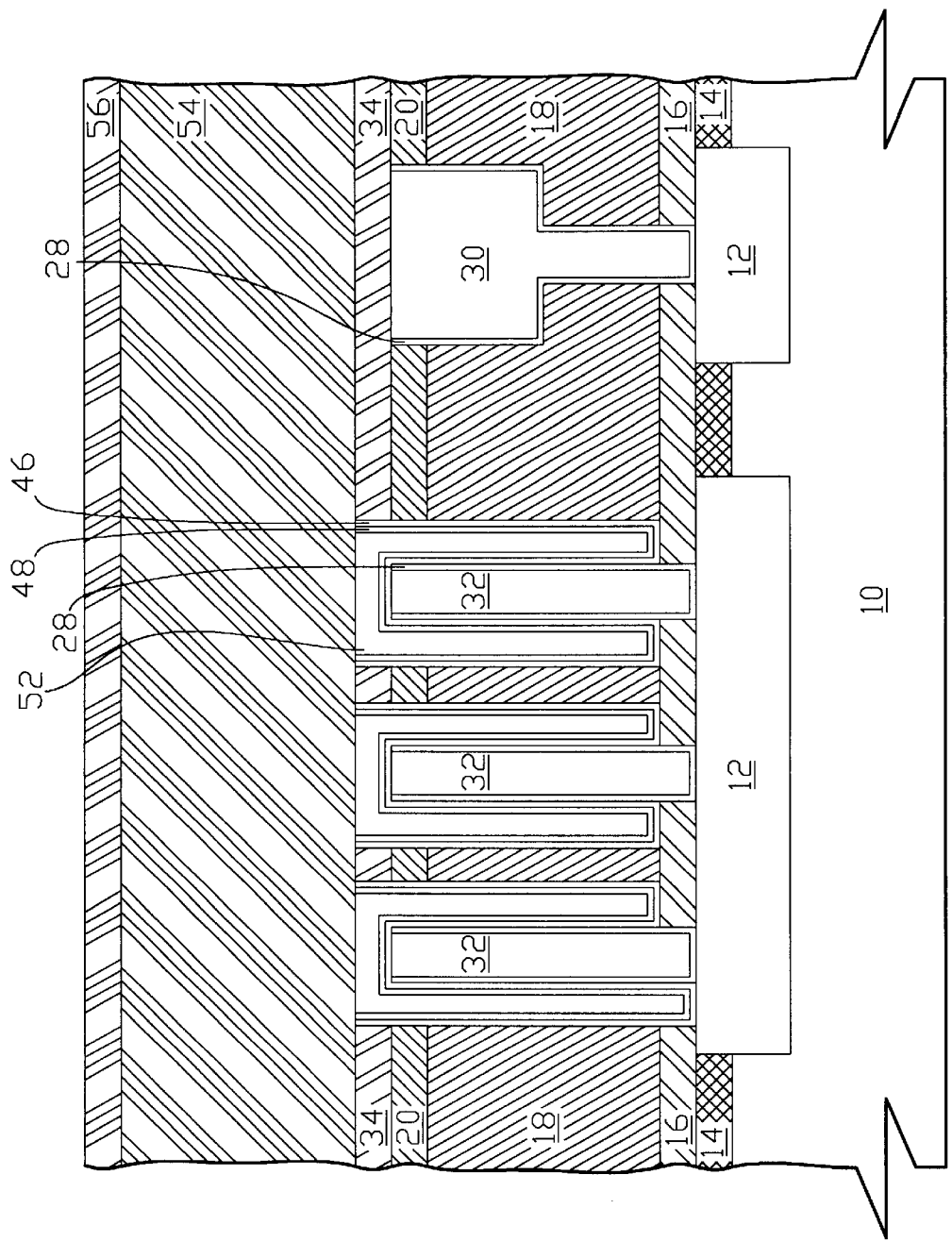
Figure 10:
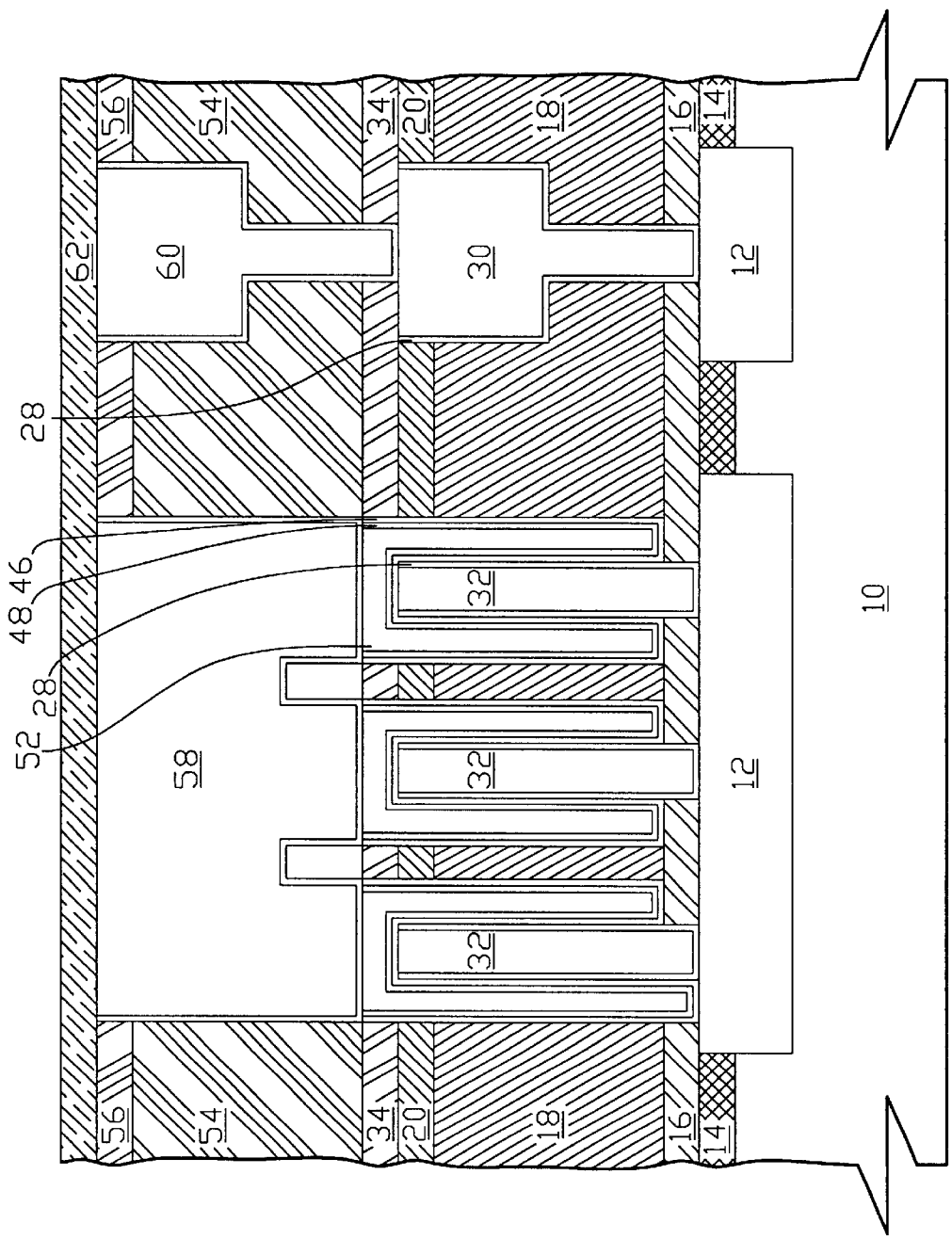

Thereafter, referring to FIG. 9, the second dielectric layer 54 is formed on the structure of the FIG. 8, and a second hard mask layer 56 is deposited on the second dielectric layer 54. Then, the second metal electrode plate of the vertical three-dimensional MIM capacitor and the second layer of the copper dual damascene structure are defined by a conventional copper dual damascene structure technique as shown in FIG. 10. Next, the third metal layer is deposited to fill with the second layer 60 of the copper dual damascene structure, and the second layer of a vertical three-dimensional MIM capacitor to form a second metal electrode plate 58. Thereafter, the third cap layer 62 is deposited on the above structure after second CMP process to polish the excess third metal layer and stop on the second hard mask layer 56.

According to abovementioned, we can achieve the advantages as following:

Firstly, according to the capacitor structure of the present invention is provided a vertical three-dimensional MIM capacitor structure on the substrate to diminish the space structure on the chip and raise the capacitance density of the capacitor structure in the logic integrated circuit.

Secondly, according to the steps for forming the structure of the vertical three-dimensional MIM capacitor of FIG. 2 to FIG. 9, the vertical three-dimensional MIM capacitor structure is compatible with the copper dual damascene structure techniques such that the fabricating steps can be simplified.

Thirdly, according to FIG. 2 to FIG. 9, the second metal electrode plate and the second layer of the copper dual damascene structure are defined simultaneously, such that the fabricating the vertical three-dimensional MIM capacitor has an extra photomask and the fabricating process is comparable with defining the copper dual damascene structure.

Although specific embodiments have been illustrated and described, it will be obvious to those skilled in the art that various modifications may be made without departing from what is intended to be limited solely by the appended claims.

What is claimed is:

1. A method for fabricating a vertical three-dimensional capacitor structure integrated with a damascene structure, said method comprising steps of:

providing a substrate;

forming a first dielectric layer on said substrate;

forming a first via opening and first trench opening of said damascene structure, and a first opening within said first dielectric layer on said substrate simultaneously by using a photolithography processes;

depositing a first copper metal layer to fill with said first via opening and said first trench opening of said damascene structure to form a first layer of said damascene structure, and on said first opening to form a first contact;

forming a photoresist layer cover said damascene structure;

etching said first dielectric layer to form an inverse U-type opening;

removing said photoresist layer;

depositing a blanket insulator layer on sidewall of said inverse U-type opening;

forming a second copper metal layer to fill with said inverse U-type opening;

planarizing said second copper metal layer to form an inverse U-type contact;

depositing a second dielectric layer on the portion of said inverse U-type contact and on said damascene structure; and forming a second layer of said damascene structure and a second metal electrode plate on said inverse U-type contact simultaneously.

2. The method according to claim 1, wherein material of said dielectric layer can be a low dielectric constant layer.

3. The method according to claim 1, wherein the material of said blanket insulator layer can be a high dielectric constant layer.

4. The method according to claim 3, wherein said high dielectric constant layer is selected from the group consisting of $Ta_2O_5$, $Al_2O_3$, and BSTO.

5. The method according to claim 1, wherein said step of forming said second copper layer comprises an electroplating method.

6. The method according to claim 1, wherein said step of forming said second layer of said damascene structure and forming said second metal electrode plate can be the same fabricating process.

* * * * *